(12) United States Patent
Dick et al.

(10) Patent No.: US 7,389,877 B2
(45) Date of Patent: Jun. 24, 2008

(54) APPARATUS FOR PACKAGING ELECTRONIC COMPONENTS INCLUDING A REEL ENTRAINED WITH DESICCATING MATERIAL

(75) Inventors: Stefan Dick, Weichering (DE); Michelle Martin, Palm Springs, CA (US); Francois Dessus, Chamarande (FR)

(73) Assignee: Sud-Chemie Inc., Louisville, KY (US)

( * ) Notice: Subject to any disclaimer, the term of this patent is extended or adjusted under 35 U.S.C. 154(b) by 552 days.

(21) Appl. No.: 11/005,289

(22) Filed: Dec. 6, 2004

(65) Prior Publication Data
US 2005/0098475 A1 May 12, 2005

Related U.S. Application Data

(63) Continuation-in-part of application No. 10/996,916, filed on Nov. 24, 2004, now Pat. No. 7,335,422, which is a continuation-in-part of application No. 10/328,579, filed on Dec. 24, 2002, now Pat. No. 7,201,959, which is a continuation-in-part of application No. 09/649,903, filed on Aug. 28, 2000, now Pat. No. 6,827,218.

(60) Provisional application No. 60/375,841, filed on Apr. 25, 2002.

(51) Int. Cl.
| B65D 85/00 | (2006.01) |
| B65D 81/26 | (2006.01) |
| B65B 9/00  | (2006.01) |
| B65H 75/18 | (2006.01) |
| H01L 21/00 | (2006.01) |

(52) U.S. Cl. ............... 206/713; 53/450; 53/453; 206/204; 206/389; 206/714; 242/610.6; 438/106

(58) Field of Classification Search ............... 206/714, 206/718, 713, 716, 717, 410, 204, 389; 53/450, 53/453; 242/610, 610.4, 610.6; 438/106–107
See application file for complete search history.

(56) References Cited

U.S. PATENT DOCUMENTS

| 2,446,361 A | 8/1948 | Clibbon |
| 2,781,326 A | 2/1957 | Lewis, Jr. |
| 3,245,946 A | 4/1966 | O'Connor |
| 3,833,406 A | 9/1974 | White |
| 4,013,566 A | 3/1977 | Taylor |
| 4,013,799 A | 3/1977 | Smalligan |
| 4,061,807 A | 12/1977 | Shaler |

(Continued)

FOREIGN PATENT DOCUMENTS

DE  2721511  11/1977

(Continued)

*Primary Examiner*—Byron P Gehman
(74) *Attorney, Agent, or Firm*—Scott R. Cox (57) ABSTRACT

An apparatus for packaging electronic components, particularly integrated circuits, which includes a carrier tape into or on which the integrated circuits can be secured, a packing reel, to which is secured the carrier tape, wherein one or more components of the packing reel is composed of a plastic material and a desiccating material, and preferably a copolymer, and optionally an electrostatic dissipating product. The packing reel may further include a humidity indicating system. The apparatus may also be placed within a water and moisture-proof barrier bag for shipment purposes.

29 Claims, 6 Drawing Sheets

U.S. PATENT DOCUMENTS

| | | | |
|---|---|---|---|
| 4,203,876 A | 5/1980 | Dereppe | |
| 4,407,897 A | 10/1983 | Farrell | |
| 4,427,992 A | 1/1984 | Ritchie | |
| 4,568,416 A | 2/1986 | Okui | |
| 4,633,032 A | 12/1986 | Oido | |
| 4,665,050 A | 5/1987 | Degen | |
| 4,792,484 A | 12/1988 | Moritani | |
| 4,894,417 A | 1/1990 | Holden | |
| 4,971,196 A | 11/1990 | Kitamura | |
| 5,078,909 A * | 1/1992 | Shigeta et al. | 252/194 |
| 5,095,626 A | 3/1992 | Kitamura | |
| 5,136,827 A | 8/1992 | Sawaya | |
| 5,238,648 A | 8/1993 | Kremen | |
| 5,288,532 A | 2/1994 | Juhl | |
| 5,293,996 A | 3/1994 | Duncan | |
| 5,295,297 A | 3/1994 | Kitamura | |
| 5,318,181 A | 6/1994 | Stover | |
| 5,389,709 A | 2/1995 | Itamura | |
| 5,390,472 A * | 2/1995 | Weiler et al. | 53/412 |
| 5,401,706 A | 3/1995 | Fischer | |
| 5,432,214 A | 7/1995 | Lancesseur | |
| 5,496,397 A | 3/1996 | Fischer | |
| 5,591,379 A | 1/1997 | Shores | |
| 5,702,508 A | 12/1997 | Moratalla | |
| 5,789,044 A * | 8/1998 | Ram et al. | 242/610.6 |
| 5,857,573 A | 1/1999 | Pakeriasamy | |
| 5,875,892 A | 3/1999 | Martin | |
| 5,875,897 A | 3/1999 | Duncan | |
| 5,911,937 A | 6/1999 | Hekal | |
| 5,934,494 A | 8/1999 | Takahashi | |
| 6,059,860 A | 5/2000 | Larson | |
| 6,080,350 A | 6/2000 | Hekal | |
| 6,116,423 A | 9/2000 | Troxtell | |
| 6,124,006 A | 9/2000 | Hekal | |
| 6,130,263 A | 10/2000 | Hekal | |
| 6,174,952 B1 | 1/2001 | Hekal | |
| 6,177,183 B1 | 1/2001 | Hekal | |
| 6,187,269 B1 | 2/2001 | Lancesseur | |
| 6,194,079 B1 | 2/2001 | Hekal | |
| 6,206,198 B1 | 3/2001 | Troxtell | |
| 6,214,255 B1 | 4/2001 | Hekal | |
| 6,221,446 B1 | 4/2001 | Hekal | |
| 6,279,736 B1 | 8/2001 | Hekal | |
| 6,451,623 B1 * | 9/2002 | Kawada | 438/106 |
| 6,465,532 B1 | 10/2002 | Hekal | |
| 6,469,372 B2 | 10/2002 | Hayden | |
| 6,486,231 B1 | 11/2002 | Hekal | |
| 6,613,405 B1 | 9/2003 | Hekal | |
| 6,684,605 B2 | 2/2004 | Weder | |
| 6,696,002 B1 | 2/2004 | Hekal | |
| 6,827,218 B1 | 12/2004 | Dick | |
| 6,981,993 B2 * | 1/2006 | Kawada | 242/610.6 |
| 2002/0073530 A1 | 6/2002 | Ferri | |
| 2002/0185409 A1 * | 12/2002 | Morrow | 206/204 |
| 2006/0076454 A1 * | 4/2006 | Kawada | 206/713 |

FOREIGN PATENT DOCUMENTS

| | | |
|---|---|---|
| DE | 4013799 | 10/1991 |
| EP | 0 400 460 | 12/1990 |
| EP | 0 401 666 | 12/1990 |
| EP | 0 432 438 | 6/1991 |
| EP | 1 021 070 | 7/2000 |
| WO | WO 96/33108 | 10/1996 |
| WO | WO 97/32663 | 9/1997 |
| WO | WO 01/83331 | 11/2001 |

* cited by examiner

APPARATUS FOR PACKAGING ELECTRONIC COMPONENTS INCLUDING A REEL ENTRAINED WITH DESICCATING MATERIAL

CROSS REFERENCE TO RELATED APPLICATIONS

This application is a continuation-in-part of application Ser. No. 09/649, 903, filed Aug. 28, 2000, now U.S. Pat. No. 6,827,218, and also a continuation-in-part of application Ser. No. Ser. No. 10/996,916, filed on Nov. 24, 2004, now U.S. Pat. No. 7,335,422 which was a continuation-in-part of application Ser. No. 10/328,579, filed Dec. 24, 2002, now U.S. Pat. No. 7,201,959 which claims the benefit of U.S. provisional application No. 60/375,841, filed on Apr. 25, 2002, now U.S. Pat. No. 7,201,959. The contents of all applications are incorporated herein by reference.

BACKGROUND OF INVENTION

This invention relates to an apparatus for packaging electronic components. In particular, this invention relates to an apparatus for packaging integrated circuits contained in or on a carrier tape, wherein the apparatus includes a carrier tape secured to a packing reel containing a central hub and parallel flanges, wherein the composition of one or more of the components of that packing reel includes a plastic material and a desiccating material and, in addition, preferably includes a copolymer and an electrostatic charge dissipating and/or anti-static material. A humidity indicating system is also preferably secured to the packing reel.

Electronic components, such as integrated circuits ("IC"), are conventionally shipped from a factory to the user in large quantities. To protect these ICs during transportation, they are generally secured in special tubes, trays or to a carrier tape secured to a specialized packing reel. Plastic ICs are susceptible to moisture due to the permeable nature of their plastic composition. It is well known that ICs, which have been contaminated by high levels of moisture, may not be useful. Mechanical failure of such moisture contaminated ICs often leads to the subsequent failure of the device which contains the ICs due to thermal and mechanical stress. Accordingly, exposure of ICs to moisture should be limited.

One specialized type of packaging for ICs, is discussed in U.S. Pat. Nos. 4,971,196, 5,095,626, 5,293,996 and 5,295,297. Each of the packaging containers incorporates a moisture indicator device secured to the inside surface of the packaging container. Specifically, U.S. Pat. No. 5,293,996 discloses a packaging container for integrated circuits containing an observation window. The container is divided into three sections, wherein one of those sections contains a compartment (11) housing a humidity indicator device (16). The humidity indicator device (16) is preferably a humidity indicator card. As best understood the card is merely placed within the compartment for viewing. The composition of the packaging material of the compartment containing the humidity indicator card is a transparent plastic which permits the moisture indicator card to be viewed from outside of the packaging container.

Another form of apparatus for packaging integrated circuits is disclosed by U.S. Pat. No. 5,318,181, which discloses compartmentalized humidity sensing indicators. These humidity sensing indicators are placed on a tape reel and are secured to its inside surface. Other packing or tape reel systems for ICs are disclosed in U.S. Pat. Nos. 5,875,897, 6,206,198 and 6,469,372.

In addition to their susceptibility to moisture, ICs can also be damaged by static electricity. Therefore, it is important that the packaging for such electronic components also be resistant to electrostatic charge. This resistance should be present in the tray or reel on which the ICs are stored as well as in any moisture-proof bag in which the tray or reel is shipped. Packaging systems for ICs, which are resistant to electrostatic charge are disclosed in U.S. Pat. Nos. 5,875,897, 5,136,827 and 4,568,416.

It is well known that electronic components are also sensitive to particles and dust. Therefore, manufacturing and assembly of electronic devices is performed in clean rooms of class 100-10.

Apparatus for packaging and shipping integrated circuits often must include desiccant products because of the sensitivity of the integrated circuits to moisture.

It is also well accepted in industry that integrated circuits can suffer from contamination with volatile organic compounds (VOC) being emitted from some packaging material. To be useful in the industry these materials must show an extremely low concentration of VOC being emitted during the shelf life of the packaged integrated circuits.

As referenced above, integrated circuits are particularly susceptible to moisture and can also be damaged by static electricity. Further, these components are particularly sensitive to dust.

Accordingly, in one process of the prior art, integrated circuits have been packaged for shipping in a carrier tape and packing reel system using a complicated and expensive process which includes at least the following process steps:
 a) inserting the integrated circuits into a carrier tape;
 a) securing the carrier tape to the packing reel;
 c) baking the integrated circuits dry;
 d) inserting the packing reel and tape in a moisture and water-proof bag;
 e) inserting desiccant bags into the moisture-proof bag;
 f) placing a humidity indicator card into the bag; and
 g) sealing the bag; and
 h) placing the sealed bag into a transport box.

An alternative procedure includes at least the following steps:
 a) baking the integrated circuits dry separately from the carrier tape and packing reel;
 b) inserting the dried integrated circuits into cavities or slots in carrier tape;
 c) securing the carrier tape to a packing reel;
 d) inserting the carrier tape on the packing reel in a moisture and water-proof bag;
 e) inserting desiccant bags into the moisture-proof bag;
 f) placing a humidity indicator card into the bag;
 g) sealing the bag; and
 h) placing the sealed bag in a transport box.

Yet another alternative procedure includes at least the following steps:
 a) inserting the integrated circuits into a carrier tape;
 b) baking the integrated circuits dry on the carrier tape;
 c) securing the carrier tape to a packing reel;
 d) inserting the packing reel and tape in a moisture and water-proof bag;
 e) inserting desiccant bags into the moisture-proof bag;
 f) placing a humidity indicator card into the bag;
 g) sealing the bag; and
 h) placing the sealed bag in a transport box.

In addition to the fact that these processes are complicated, labor-intensive and time-intensive, the integrated circuits are protected from moisture only after the moisture-proof bag is sealed. Thus, the integrated circuits can still absorb moisture at any time from their original baking until the sealing of the bag.

Another disadvantage of the prior art processes is that the integrated circuits are exposed to dust generated from the desiccant bags themselves or the out gassing of VOC.

Yet another disadvantage of prior art process is that the desiccant bags packaged together with the packaging reel in the bag are rather bulky and lead to "humps" on the surface of the bags. These bags can thus not be packaged by being stacked on each other but require an additional packaging component for mechanical stability. This requirement leads to additional packaging material and labor cost.

Accordingly, it is an object of this invention to prepare a carrier tape and packing reel apparatus for packaging electronic components which reduces the level of moisture within the container holding that packing reel during shipment.

These and other objects and features of the present invention will become apparent to those skilled in art from a consideration of the following detailed description, drawings and claims. The description along with the accompanying drawings provides a selected example of the construction of the device and its process of manufacturing to illustrate the invention.

SUMMARY OF THE INVENTION

In accordance with the present invention, there is provided an apparatus for packaging electronic components, which components are sensitive to humidity, which includes a carrier tape (20) and packing reel (40) for holding electronic components, such as integrated circuits (12), wherein the packing reel (40) includes a central hub (42) and parallel flanges (44, 46), wherein the composition of one or more of the components of the packing reel (40) comprises a polymeric material, and a desiccant for absorbing moisture surrounding the packing reel. Preferably, the composition also includes a copolymer and an electrostatic charge dissipating and/or anti-static material.

Alternatively, the present invention provides an apparatus (10) for packaging electronic components, which components are sensitive to humidity, which includes a carrier tape (20) for holding the electronic components, a packing reel (40) including a central hub (42) and parallel flanges (44, 46), wherein the composition of one or more of these components of the packing reel (40) comprises a polymeric material, and a desiccant for absorbing moisture contained or penetrating into the packaging during shipment and preferably a copolymer and an electrostatic charge dissipating and/or anti-static material, and a humidity indicating system (90), secured to the packing reel (40), for determining the humidity level associated therewith.

The present invention further includes the apparatus discussed above placed within a moisture-proof barrier bag (60) for shipment.

The present invention further includes a process for the filling and shipping of an apparatus (10) for packaging integrated circuits (12) comprising introducing integrated circuits (12) into openings (22) or to the surface of a carrier tape (20);

securing the carrier tape (20) to the packing reel (40);

wherein one or more components of the packing reel (40) are comprised of a polymeric material, and a desiccant for absorbing moisture, and preferably a copolymer;

baking the integrated circuits (12) in situ to remove moisture; and placing the packing reel (40) and carrier tape (20) containing integrated circuits (12) within a moisture-proof barrier bag (60).

Alternatively, the present invention includes a process for the filling and shipping of a packing reel (40) and carrier tape (20) containing integrated circuits (12) comprising securing dry, baked integrated circuits (12) into openings (22) or to the surface of a carrier tape (20);

securing the carrier tape (20) to a packing reel (40), wherein the packing reel is comprised of a polymeric material, a desiccant for absorbing moisture, and preferably a copolymer; and placing the carrier tape (20) and packing reel (40) containing integrated circuits (12) within a moisture-proof barrier bag (60).

In another alternative embodiment, the present invention includes a process for the filling and shipping of a packing reel (40) and carrier tape (20) containing integrated circuits (12) comprising introducing integrated circuits (12) into openings (22) or to the surface of a carrier tape (20);

securing the carrier tape (20) to the packing reel (40);

wherein one or more components of the packing reel (40) are comprised of a plastic material, and a desiccant for absorbing moisture and preferably a copolymer;

baking the integrated circuits (12) in situ to remove moisture; and placing the packing reel (40) and carrier tape (20) containing integrated circuits (12) within a moisture-proof barrier bag (60).

BRIEF DESCRIPTION OF THE DRAWINGS

This invention will now be described with reference to the accompanying drawings.

DETAILED DESCRIPTION OF THE PREFERRED EMBODIMENT

Electronic components, such as semi-conductor chips or integrated circuit chips, after manufacture and prior to utilization, are temporarily stored and shipped using a number of different storage systems, including tubes, trays, carrier tape and packing reel apparatus. Current dry packing practices involve baking such electronic components until dry, placing them into a dry pack with desiccant bags and humidity indicator cards, sealing the bag immediately and shipping the sealed bag to the customer.

Figure 1:
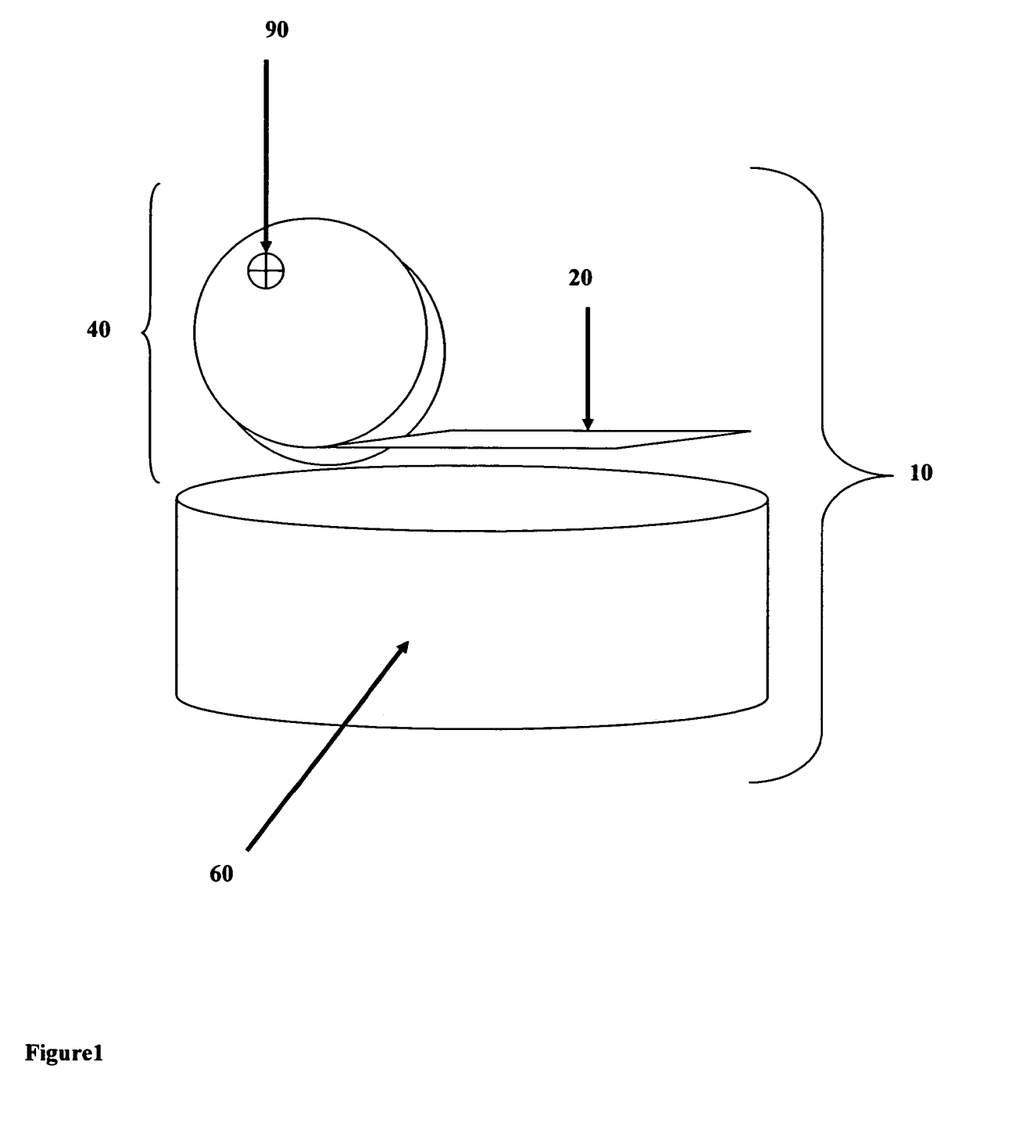
FIG. 1 is perspective view of the apparatus for packaging electronic components of the invention.

The components of the apparatus (10) for packaging integrated circuits of the present invention, as shown in FIG. 1, include a carrier tape (20) to hold the electronic components, such as integrated circuits, a packing reel (40), to which the carrier tape (20) is secured, preferably a moisture proof barrier bag (60) and optionally a shipping container (not shown).

Optionally, a humidity indicator system (90) is incorporated into the apparatus (10), as shown in FIG. 1.

Figure 4:
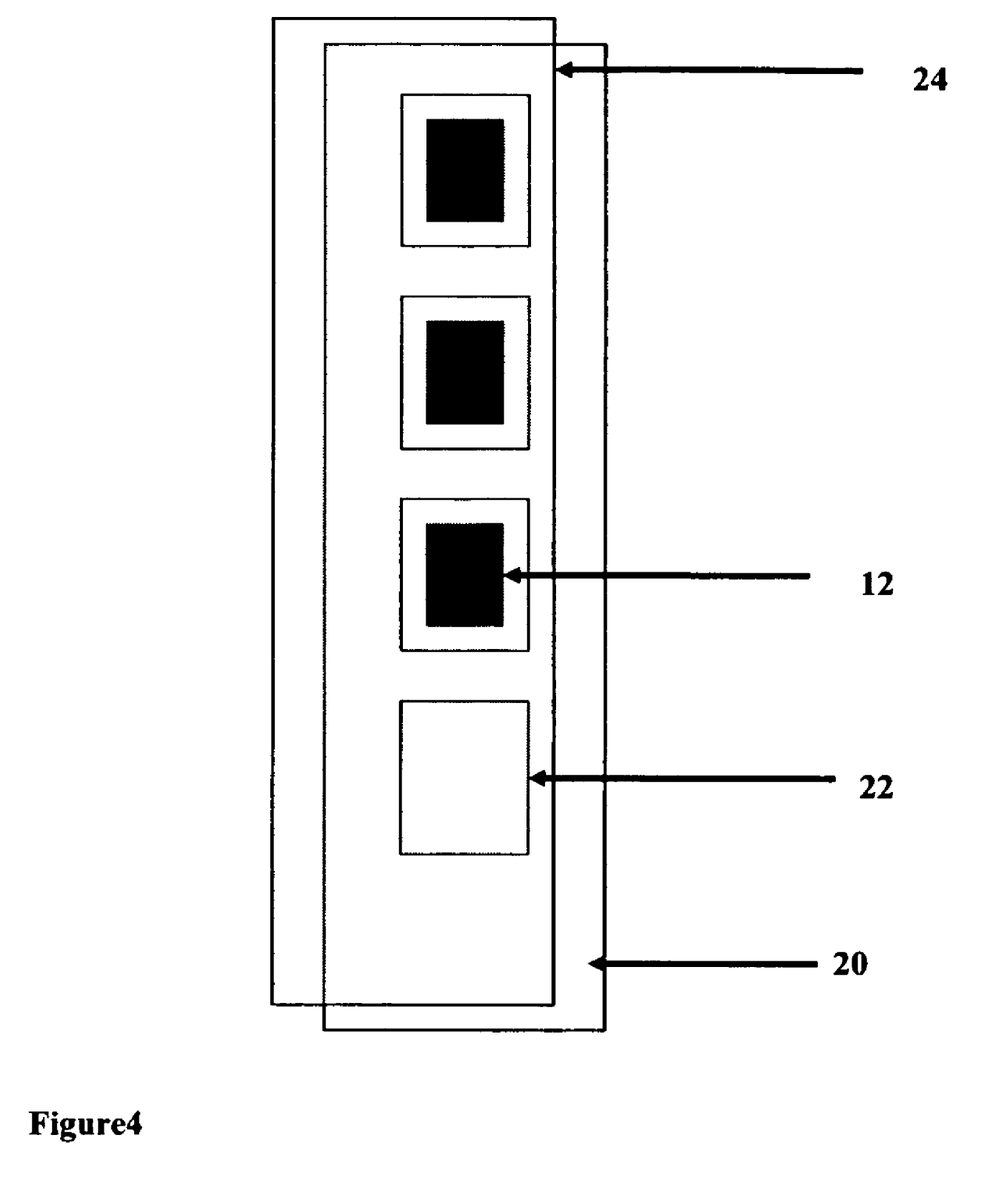
FIG. 4 is a top view of the carrier tape of FIG. 1 showing the introduction of integrated circuits into cavities within that carrier tape.

Prior to packaging, the electronic components, such as integrated circuits (12), are first placed on or within openings (22) in the carrier tape (20) as shown in FIG. 4. After placement in the openings (22), the carrier tape (20) is covered with an adhesive covering (24) to hold the ICs in position on the carrier tape (20). Alternatively, the ICs may be secured adhesively to the carrier tape (20) without the use of openings in the carrier tape. (The design of many of the components of apparatus for packaging ICs has been established under the JEDEC conventions.)

Figure 2:
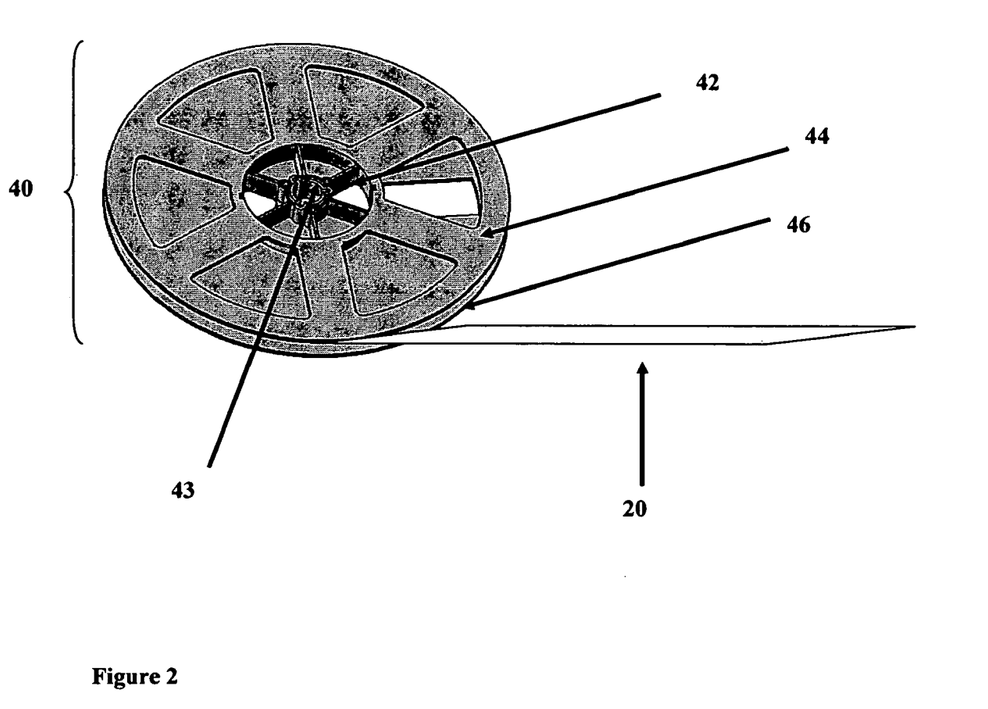
FIG. 2 is a perspective view of the packaging reel and carrier tape of the FIG. 1.

The packing reel (40) of the apparatus (10) is comprised of at least a central hub (42) and a pair of parallel flanges (44, 46) secured to the central hub (42), as shown in FIG. 2. The central hub (42) contains an opening (43) to permit the packing reel (40) to be placed on a rotation device to wind the carrier tape (20) on and off of the packing reel (40). The central hub (42) may be any size, diameter, or radius depending on the needs of the consumer. In one preferred embodiment, the radius of the central hub (42) is about 25% of the overall radius of the packing reel (40). The parallel flanges (44, 46) are secured to, or formed as a part of the outside surface (47) of, the central hub (42) and extend outward from the central hub, as shown in FIG. 2. Each flange (44, 46), in a preferred embodiment, has an outer rim (50) with spokes which provide mechanical support, stability and rigidity to the packing reel (40).

Figure 3:
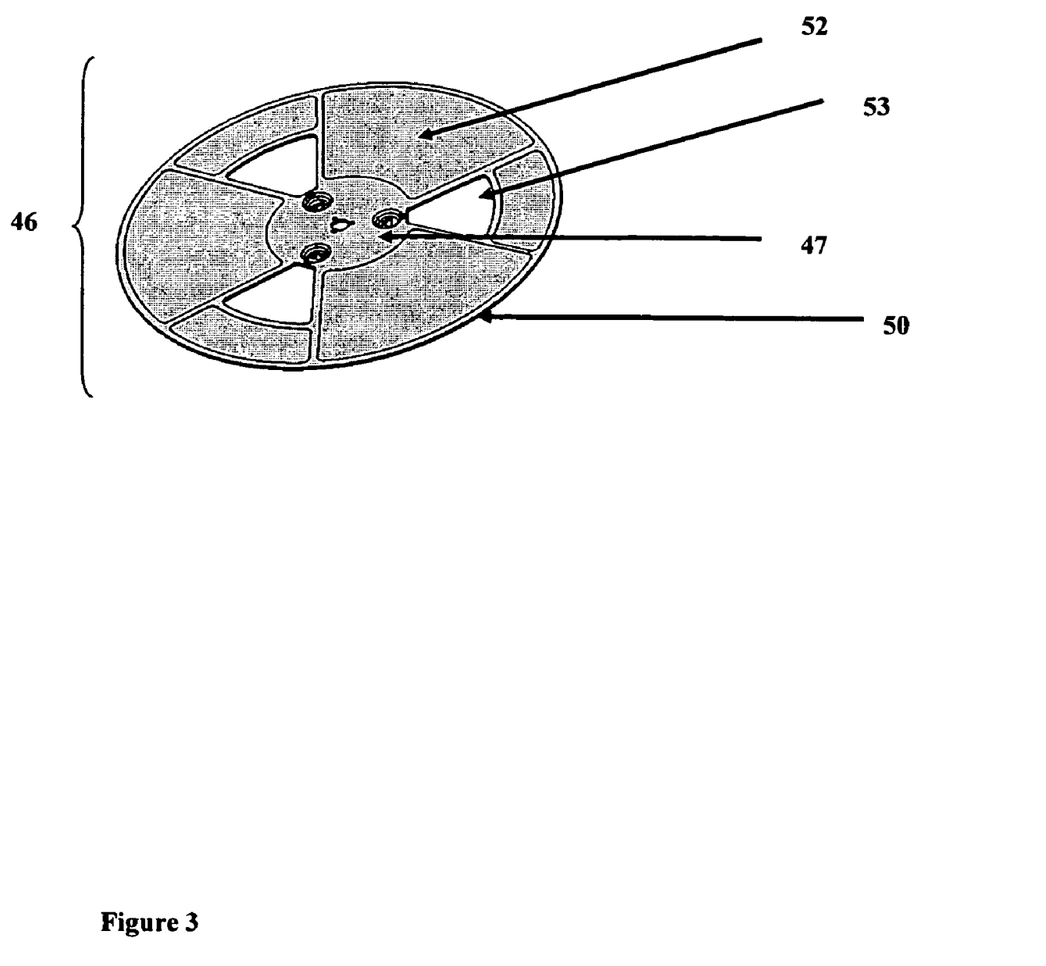
FIG. 3 is a perspective view of one of the flanges of the packaging reel shown in FIGS. 1 and 2.

A portion of the surface of the flanges (44, 46) is formed into solid areas (52) for required labels, as shown in FIG. 3. Preferably, a number of openings (53) are also provided in the parallel flanges (44, 46) to allow air to flow through the packing reel (40). These openings (53) also permit the passage of heat during the drying process and reduce the amount of plastic that is required to be used to form the parallel flanges (44, 46). Preferably, the openings (53) in each of the parallel flanges (44, 46) are lined up and located opposite of each other to permit the free passage of air. Alternatively, if preferred by the consumer, the flanges are solid except for a pair of openings on opposite sides of the flanges (44, 46) to assist in carrying of the packing reels (40).

One or more components of the composition of the packing reel (40) comprise at least one thermoplastic or thermosetting plastic, polymeric material, at least one desiccant material, preferably a copolymer, and preferably at least one material that contains electrostatic discharge or anti-static properties.

It is not required that all components of the packing reel (40) be manufactured from the above-referenced polymeric materials containing a desiccant, preferably a copolymer, and preferably at least one material that contains electrostatic discharge or antistatic properties. In one embodiment, the central hub (42) is manufactured from the above-described composition, while the flanges (44, 46) are manufactured from conventional plastic materials. In an alternative embodiment, the composition of each of the central hub (42) and the parallel flanges (44, 46) can differ, with some elements containing more or less of the selected individual components. In addition, the amount of desiccant material contained within any particular component of the packing reel (40) can be adjusted to the particular desiccation needs of the specific application. For example, in one embodiment, all three components i.e. the central hub (42) and each of the parallel flanges (44, 46), are manufactured of the above-described combination materials, while in another embodiment, only the central hub (42) is manufactured of this composition, while the parallel flanges are manufactured of a conventional plastic material without a desiccant.

The amount of desiccant required for a particular integrated circuit packaging application depends on a number of factors, such as moisture sensitivity of the circuits, desired shelf life, moisture vapor transmission rate of the packaging bag and moisture content of the dunnage material that may be packaged together with the integrated circuits. In the present invention, the amount of desiccant can be adjusted by including within one, two or three components or parts of the reel a desiccant, and by choosing an individual desiccant fill rate for each component that is appropriate for the particular circumstances. While there is no particularly preferred embodiment, as the amount of desiccant needed depends on the above mentioned factors, generally the desiccant comprises from about 15% to about 80% by weight of any component needed for absorption of moisture.

One or more components of the packing reel (40) may also contain up to 10 percent, preferably up to 5 percent of one or more processing aids, stabilizers fillers, reinforcing agents, plasticezers, slipping agents, wetting agents, dispersants, anticlumping agents, dyes, blowing agents, and pigments, as desired.

Notwithstanding, the composition preferably does not include wicking fibers, as these wicking fibers may burn or melt during the manufacturing process. The inclusion of fibers to act as a wick for moisture is unnecessary because of the increased moisture absorbency of the composition of the invention.

Well known plastic materials may be used to form the components of the packing reel (40) including polymers obtained from single monomers, copolymers with two or more monomers, a mixture of two or more polymers obtained from single monomers, a mixture of two or more copolymers, and a mixture of at least one polymer obtained using a single monomer and at least one copolymer. Non-limiting examples include polyolefins, polyethylene, ethylene copolymers (e.g. EVA), polypropylene, polybuten-1, polyisobutylene, polyvinylchloride, vinylchloride copolymers, polyvinylidene chloride, polystyrene, styrene copolymers, cellulose derivatives, polyamide, polycarbonate, polyoxymethylene, polyethyleneterephthalate, polybutyleneterephthalate, copolyester, polyphenylenoxides, polymethymethacrylate, acrylate copolymers, flourine containing polymers, polyphenylenesulphide, polyarylsulphones, polyaryletherketones, polyetherimids, polyimids, thermoplastic elastomers, polyurethanes, phenol resins, melamine resins, urea resins, epoxy resins and unsaturated polyester resins.

Preferably, the composition of one or more components of the packing reel (40) also includes a copolymer. It has been surprisingly discovered that when a suitable copolymer is added to the polymeric material and the desiccant material and when the mixture is in a melted state, the desiccant material migrates to the free surfaces of the composition during the forming process resulting in a concentration of the adsorbent material on the two free surfaces and a reduction of the desiccant material in the middle of the composition.

The copolymer may be selected from the group consisting of styrene-butadiene rubbers (SBR), styrene-ethylene-butadiene-styrene copolymers (SEBS), butane-ethylene-propylene terpolymers, ethylene-propylene copolymers, butyl rubbers, ethylene-propylene rubbers (EPR), ethylene-propylene-diene monomers (EPDM), and vinyl ethylene acetate copolymers (EVA) and butadiene-acrylonitrile.

When a copolymer or a mixture of copolymers is used, a preferred combination comprises monomers, polymers and copolymers that have a common chemical monomeric unit. For example, the thermoplastic material may be prepared from linear low density polyethylene (LLDPE) and low density polyethylene (LDPE) and ethylene vinyl acetate (EVA) copolymer, wherein each of the components includes an ethylene monomeric unit. Another example is using polystyrene with styrene-ethylene-butylene-styrene block-copolymers with styrene being the common monomeric unit.

The desiccant product is next incorporated into the thermoplastic and/or thermosetting plastic, polymeric material. The desiccant product may be one or more selected from the group of desiccating agents including silica gel, a desiccant clay, activated alumina, calcium oxide, barium oxide, natural or synthetic zeolites (including molecular sieve compounds), aluminum alkoxides, or the like. Deliquescent salts such as magnesium sulfate, calcium chloride, aluminum chloride, lithium chloride, calcium bromide, zinc chloride, or the like are less preferred as they form hydrates during the moisture absorption process that may bleed out of the plastic materials resulting in contamination. In a preferred embodiment, a molecular sieve, such as NK 10 AP, produced by Ceca, is incorporated into the plastic material.

The composition is prepared such that the desiccant tends to concentrate in a gradient within a migration zone near the surface of the polymeric composition. In a preferred embodiment, the concentration of the desiccant at the surface creates distinct layers of the composition, which are identifiable, i.e., a surface layer that is enriched in the desiccant and an interior layer that is depleted of that same desiccant. "Layered" as used herein means a significant change in concentration gradient such that the product appears to be layered, and does not necessarily mean a solid layer of one component and a second layer of a different component.

The surface layers (usually on both opposite surfaces) of the product made from the polymeric composition generally form relatively well defined "migration zones", to which the desiccant "migrates." Within this migration zone the maximum concentration of the desiccant at a given volume unit is from 2 to 10 times, preferably 2 to 6 times, higher than its concentration in the interior or core layer of the product. The concentration of the desiccant within the migration zone preferably exhibits a gradient towards the surface. The concentration of the desiccant at any location within the product and the extent of the migration of the desiccant may be determined by infra-red microanalysis. For that purpose the integrated peak intensities of characteristic IR absorption bands of desiccant (and copolymer, if used) are measured as functions of depth $\delta$, using transversal microtomic cuts of a suitable thickness (e.g. 30 μm). The individual values are standardized by comparison to the integrated absorption intensity of the polymer component at the respective depth $\delta$ and plotted as functions $D(\delta)$ and $C(\delta)$ of depth from the surface for values 0 to d (d being the total thickness of the part). The amount of desiccant contained at any depth interval ($\Delta\delta=\delta_2-\delta_1$) can be calculated from the quotient of $\int D(\delta) \, d\delta$ (limits $\delta_1$, $\delta_2$) and $\int D(\delta) \, d\delta$ (limits 0, d). The "migration zones" are defined by the depth from the surface at which the accumulation of desiccant has leveled off ($\delta_1$), and starts to increase ($\delta_r$), respectively. The amount of desiccant contained in these zones can be calculated as explained above by calculating the quotient of $\int D(\delta) \, d\delta$ (limits 0, $\delta_1$) and $\int D(\delta) \, d\delta$ (limits 0, d) for the first migration zone and of $\int D(\delta) \, d\delta$ (limits ($\delta_r$, d) and $\int D(\delta) \, d\delta$ (limits 0, d) for the second migration zone. So far all (simple) parts prepared according to this invention exhibited two migration zones; however, it cannot be excluded that parts prepared according to this invention may contain only one or more than two migration zones. When comparing the amount of desiccant that is present in the interior layer of the composition with the amount present in the migration zone (at a given volume unit), there is a reduction of at least about 50%, preferably at least about 65% and most preferably at least about 85% of the amount of the desiccant that is present in the migration zone.

The thickness of this migration zone varies depending upon a number of factors, including the composition of the thermoplastic material, the ratio of the copolymer to the polymeric material that makes up the plastic material, assuming such a blend is utilized, the concentration of the desiccant utilized, the amount of non-common monomer that is present in the blend of copolymer with polymer mixture, if such a mixture is utilized, and the parameters set when forming products from the absorbent polymeric material. In addition, it has been surprisingly discovered that the higher the percentage of copolymer present, the thicker the migration zone. Notwithstanding, it has been surprisingly discovered that the thickness of the migration zone is generally from about 1 to about 100 microns, preferably from about 10 to about 80 microns, and most preferably from about 20 to about 60 microns from the surface of the polymeric material depending on the process of manufacture of the product. While the overall thickness of the migration zone may vary, especially in products which are very thick, it has been surprisingly found that the thickness of the migration zone seems to be relatively independent of the total thickness of the material and is generally from about 1 to about 100 microns.

It has also been surprisingly discovered that the accumulation of the desiccant at a given volume unit within the migration zone is substantially greater than the accumulation at a given volume unit throughout the interior layer of the product. It has been surprisingly found that the percentage of the desiccant present in the migration zones of a product formed from the polymeric material is at least about 2%, preferably at least about 4%, and most preferably at least about 6% of the overall amount of desiccant present in the product, with the maximum amount present being no more than about 70%, preferably no more than 50% and most preferably no more than about 40% of the overall amount of desiccant.

The composition of one or more components of the packing reel (40) also preferably includes a material which introduces electrostatic charge dissipating and/or anti-static properties to the plastic material, and is selected from the group consisting of carbon products, metal powders, anionic surfactants, cationic surfactants, amines, amides, ethoxylated fatty amines, ethoxylated fatty amides and hydrophilic graft copolymers. In a preferred embodiment, a carbon black such as Printex XE2, produced by Degussa, is incorporated into the plastic material.

In general, the absorbent polymeric components used for the purpose of this invention are manufactured by compounding methods.

In one preferred method of manufacture, the polymer and copolymer (if any) are mixed by dry blending without the use of solvents or without melting the polymeric materials. The blended polymer and copolymer (if any) are then fed into a first zone of a compounding machine simultaneously (but independently) with the desiccant. This first zone of mixing is preferably kept at a temperature below the melting points of all components, preferably about 50° C. The mixture is then fed into the subsequent zones of the compounding machine where the polymer and copolymer material (if any) are melted and blended with the desiccant. In a preferred embodiment the blended materials are then extruded through a die into a cold water batch and shred into granules.

Generally, in a second step the materials are formed into the desired products (e.g. the packaging reel according to this invention, or any part of it). This forming of products may be performed by any known method for producing plastic products, such as extrusion, injection molding, etc., provided that such method involves transforming the material into essentially a non-solid state, preferably by melting the plastic material to a liquid state. While not wishing to be bound by any particular theory, it can be contemplated that only in an essentially non-solid state and during the forming process (injection molding, extrusion, etc.) is the desiccant able to migrate to the surface of a formed product. Thus, care must be taken to prepare such articles so that the desiccant and plastic may exhibit the sufficiently desired separation through the migration described herein while in the essentially non-solid state. Again, while not wishing to be bound by any particular theory, in certain embodiments in which the plastic material comprises more than one polymer or copolymer, it is believed that the desiccant has more attraction toward one of the polymeric materials and will migrate towards the surface along with the polymeric material while the separation takes place.

The thickness of the migration zone and the amount of desiccant being accumulated therein is also influenced by the parameters set during formation of the products. As indicated above, the migration of the desiccant is only possible as long as the polymeric material assumes an essentially non-solid state. Thus, parameters such as forming method (injection molding, extrusion), temperature of the absorbent polymeric material when formed, temperature regulation of tools or molds during forming, flow characteristics of the material, flow rate during forming, shape of the product formed, cycle times etc. are important in determining the amount of time of the migration of the desiccant during forming (migration time). The migration time is defined as the time while forming of a product during which the polymeric material is still in an essentially non-solid state so that migration of the desiccant can occur.

The skilled artisan can adjust the parameters mentioned above by performing routine experiments in order to optimize these parameters for each individual product concerning migration time and thus achieve the desired thickness of migration zone and accumulation of desiccant therein.

The reel (40) can be produced wherein any one or all of its components contain the desiccant material. Any components of the packing reel (40) which are not formed from the desiccant material, plastic material and the preferable copolymer are formed using conventional procedures in conventional shapes or structures.

The carrier tape (20) is conventional and preferably includes a series of cavities or openings (22) to hold the integrated circuits. Alternatively, an adhesive material may be used to cover the carrier tape (20) to which the integrated circuits are secured. In a further alternative embodiment, an adhesive material may be secured to the carrier tape (20) itself, with a further adhesive tape covering the carrier tape (20). The carrier tape (20) can be made of conventional materials, such as polystyrene or polycarbonate, and may include one or more electrostatic discharge or antistatic materials.

Figure 5:
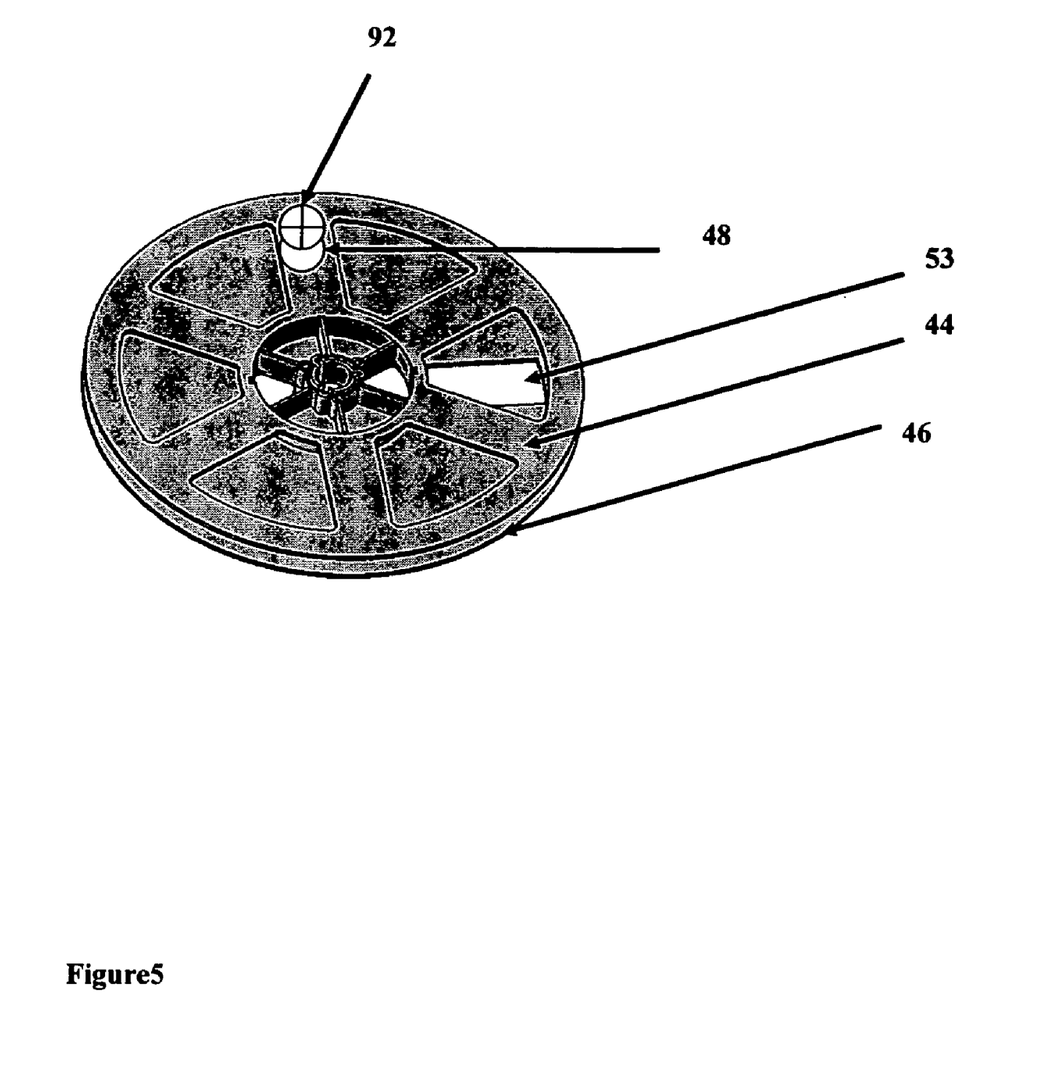
FIG. 5 is a perspective view of the packaging reel of FIG. 1 showing a humidity indicator system added thereto.
Figure 6A:
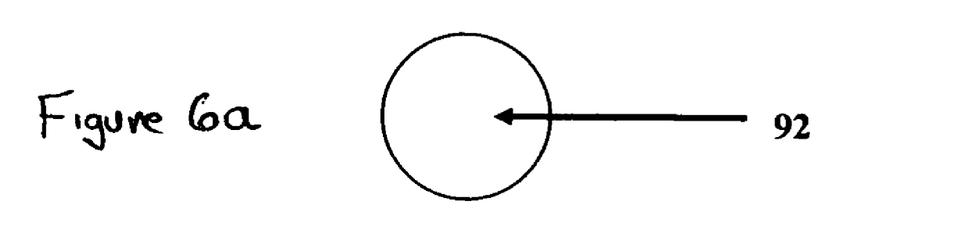
FIGS. 6a, 6b and 6c are top views of components of the humidity indicator device of FIG. 5.
Figure 6B:
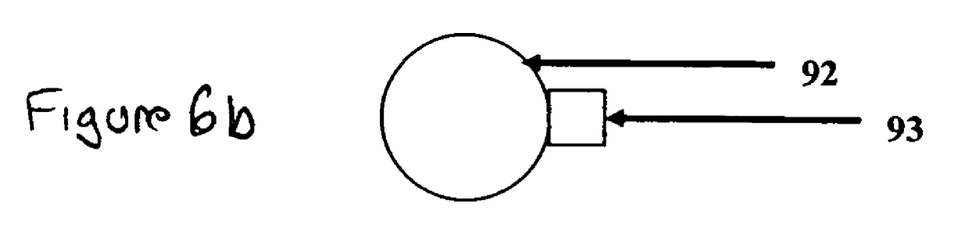
Figure 6C:
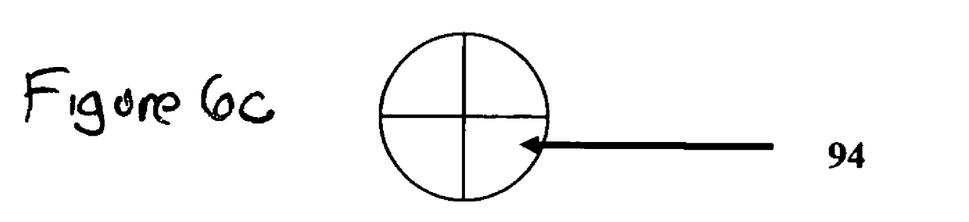

During the formation of the packing reel (40), an additional opening (48) is preferably formed in one of the flanges (44, 46) of the packing reel (40). See FIG. 5. This opening (48) is designed to hold a humidity indicator device (90) as shown in FIGS. 6a, 6b and 6c. The size and shape of this opening (48) depends upon which humidity indicator device (90) is secured to the central hub (42) of the packing reel (40).

In a preferred embodiment the opening (48) for the humidity indicator (90) is circular. Into this circular opening is placed a clear plastic circular disk (92) as shown in FIGS. 5 and 6a. This clear plastic circular disk (92) can be manufactured from any clear plastic material, preferably from copolyesters like Durastar DS2000 produced by Eastman Chemicals. This clear plastic circular disk (92) covers the opening (48) to prevent water and water-vapor from passing into the interior of that portion of the flange (44) containing the humidity indicator system (90) but allows the free flow of air from the integrated circuits to the humidity indicating system (90).

In yet another preferred embodiment, as shown in FIG. 6, the humidity indicator device (90) is attached to an opening in the reel flange (53) that may exist anyway for the passage of air, as discussed earlier. No additional opening (48) is then required. In this embodiment the circular plastic disk (92) contains a component (93) that allows the disk to snap onto the flange at the opening (53), as shown in FIG. 6b.

Secured to the inside of the clear plastic circular disk (92) is the humidity indicator element (94), as shown in FIG. 6c. The humidity indicator element (94) is preferably formed from a hydrophilic blotter substrate onto which is placed a humidity indicator solution which readily discloses the level of humidity in the air surrounding the disk (92) by changing its color depending on the level of humidity present. This substrate and humidity indicator solution are well known in the industry. The substrate is preferably blotter paper, for example, manufactured by Custom Paper. Preferably, the humidity indicating solution comprises a solution of cobalt chloride. The preferred cobalt chloride solution is also well known in the industry and is hygroscopic in nature. It demonstrates different colors or different degrees of color based on the amount of moisture in the air surrounding the humidity indicator element (94). The humidity indicator solution is incorporated onto the humidity indicator substrate by conventional means.

Once the humidity indicator solution has been secured onto the substrate, the substrate is formed into the desired shape for use as the humidity indicator element (94). The humidity indicator element (94) is preferably formed into a circular shape as shown on FIG. 6.

In order to more easily determine the level of humidity which is indicated by the color of the humidity indicator element (94), a conventional humidity comparison element (not shown) is preferably secured to the flange (44) next to the humidity indicator element (94). The humidity comparison element, which is preferably formed from a material which is not affected by the level of humidity present in the apparatus for packaging ICs (10), is used to compare the level of the humidity shown on the humidity indicator element (94) against known levels of humidity shown by different colors on the humidity comparison element. The humidity comparison element of the preferred embodiment is preferably round with a circular opening cut into its middle.

The humidity indicator element (94) is preferably secured to the back of the humidity comparison element by conventional means, such as by an adhesive or by crimping. By securing the humidity indicator element (94) to the humidity comparison element with a portion of the humidity indicator element (94) which is sensitive to humidity covering a circular opening in the middle of the humidity comparison element, it is easy for a viewer of this assembly to determine the relative humidity level within the container by merely comparing the color shown on the humidity indicator element (94) with the various colors referenced on the humidity comparison element. The size and shape of the humidity indicator element (94) and humidity comparison element can be altered from that shown in FIG. 6. In addition, a single color humidity comparison element may be substituted for a multicolored humidity comparison element.

Once the electronic components to be shipped have been placed within openings (22) on the carrier tape (20) and wound on the packing reel (40) of the apparatus for the packaging integrated circuit (10), the humidity within that container can be readily checked merely by viewing through the clear plastic disk (92) that is secured to the packing reel (40). Any water vapor surrounding the apparatus (10) will contact the humidity indicator element (92) and produce a change in its color which then discloses the moisture content of the air surrounding the apparatus (10). By comparing the color of the humidity indicator element (92) with the color shown on the humidity comparison element, the level of humidity surrounding the apparatus (10) can be readily determined.

In the preferred embodiment the apparatus (10) is placed within a moisture-proof barrier bag (60). The composition of the moisture-proof packaging bags (60) is preferably a multi-layer composite of polymer films and aluminum foil. In one preferred embodiment the vapor-proof packaging material is DRI-PAK® manufactured by Richmond Technologies.

In forming the apparatus (10) of the present invention, the components of the packing reel (40) and carrier tape (20) are first formed. The components of the packing reel (40) are formed and assembled. One or more components of the packing reel (40) are produced from a plastic material, and a desiccating material, preferably a molecular sieve material, and preferably a copolymer and an electrostatic charge dissipating material and/or an anti-static material. An opening (48) may then be cut into one of the flanges (44, 46) of the packing reel (40). Alternatively, the opening (48) may have been designed in the tools used to form the flange (44, 46) and thus have been formed during the forming process of the flange (44, 46). The humidity indicator device (90) including the humidity indicator element (94) and the circular disk (92) is then secured together by adhesive or other sealing systems. The humidity indicator device (90) is then secured through the opening (48) to the surface of one of the flanges (44, 46), preferably on the inside surface.

Alternatively, the humidity indicating system (90) is secured to an existing flange opening (52) by snapping the device in place at the opening (52). The integrated circuits are then secured to the carrier tape (20) within cavities (22) in the carrier tape (20). Alternatively, the integrated circuits can be secured directly or indirectly to the carrier tape (20) by an adhesive tape covering (24). The carrier tape (20) is then wound on the central hub (42) of the packing reel (40) until sufficient carrier tape (20) with integrated circuits is secured thereto.

These packing reels (40) with integrated circuits are then baked to dry the integrated circuits. The packing reel (40) is then inserted into the water and moisture-proof barrier bag (60) and the bag (60) is sealed.

Alternatively, the integrated circuits may be baked dry on the same or separate carriers and introduced already dry into the apparatus (10). The apparatus (10) is then inserted into the water and moisture-proof barrier bag (60) and the bag (60) is sealed.

As stated above, the packing reel (40) according to this invention already may contain a humidity indicator system (90) as a part of the design of the central hub. Alternatively, an apparatus (10) according to this invention without a humidity indicator system as an integral part of its design can be used. In this case a conventional humidity indicator card is inserted into the water and moisture-proof bag (90) prior to sealing.

By using the apparatus (10) including the packing reel (40) of the particular composition, according to the invention, several processing steps can be eliminated creating a faster process and decreasing the overhead costs. In addition, this new process reduces the time of potential exposure of the integrated circuits to moisture. Further, the problem of dust being present is reduced if not eliminated as a result of the desiccant material being encapsulated within the packing reel (40). In addition, as the desiccant material is already contained in the packing reel (40), no additional weight or volume from desiccant bags has to be added to the apparatus (10). Also the bulkiness of the packaged reel is reduced and more than one reel can be stacked on each other to be protected by one larger box instead of several smaller "pizza boxes".

By having a humidity indicator system (90) secured to one of the flanges (44, 46) of the packing reel (40), the consumer of the integrated circuits can determine merely by looking at the humidity indicator system (90) whether the level of humidity within the apparatus (10) is too high. If so, the integrated circuits may be re-baked to lower the level of the moisture present therein.

It will be apparent for the foregoing that while particular forms of the invention have been illustrated and described, various modifications can be made without departing from the spirit and scope of the invention.

The invention claimed is:

1. An apparatus for packaging integrated circuits comprising
    a carrier tape for holding integrated circuits, and
    a packing reel, wherein a composition of one or more components of the packing reel comprises a plastic material, and a desiccating material for adsorbing moisture, wherein the one or more components of the packing reel comprise a surface layer and an interior layer, wherein the desiccating material is entirely entrained within the plastic material of the one or more components, wherein the desiccating material forms a concentration gradient, and wherein the desiccating material is more highly concentrated in the surface layer than in the interior layer of the one or more components.

2. The apparatus of claim 1 further comprising a humidity indicator system secured to the packing reel, which indicator device determines a humidity level within the apparatus.

3. The apparatus of claim 2 wherein the humidity indicator system comprises a humidity indicator element and a system for securing the humidity indicator element to the packing reel.

4. The apparatus of claim 2 wherein the humidity indicator system is secured to the packing reel using a clear, plastic disk mounted within the opening in the packing reel.

5. The apparatus of claim 1 further comprising a water and moisture-proof barrier bag into which the packing reel and carrier tape is placed.

6. The apparatus of claim 1 wherein the composition further comprises a copolymer.

7. The apparatus of claim 1 wherein the composition of one or more components of the packing reel comprises a mixture of at least one polymer of a single monomer and at least one copolymer mixed with the desiccating material.

8. The apparatus of claim 7 wherein the surface layer of the one or more components of the packing reel comprise a migration zone with a thickness from about 1 to about 100 microns.

9. The apparatus of claim 8 wherein the concentration of the desiccating material within the migration zone is from about 2 to about 6 times that of the concentration of the desiccating material within the interior layer of the packing reel.

10. The apparatus of claim 1 wherein the composition of one or more components of the packing reel comprises a mixture of two copolymers containing a common monomeric unit mixed with the desiccating material.

11. The apparatus of claim 1 whereby a wicking fiber is not added to the plastic material and the desiccating material.

12. An apparatus for packaging integrated circuits comprising
a carrier tape for holding integrated circuits,
a packing reel, wherein a composition of one or more components of the packing reel comprises a plastic material, a copolymer and a desiccating material for adsorbing moisture, wherein the one or more components of the packing reel comprise a surface layer and an interior layer, wherein the desiccating material is entirely entrained within the plastic material of the one or more components, wherein the desiccating material forms a concentration gradient, and wherein the desiccating material is more highly concentrated in the surface layers than in the interior layer of the one or more components,
a humidity indicator system secured to the packing reel for determining the humidity level; and
a moisture-proof barrier bag into which the packing reel and carrier tape are placed.

13. The apparatus of claim 12 wherein the humidity indicator system comprises a humidity indicator disk and a system for securing the humidity indicator disk to the packing reel.

14. The apparatus of claim 12 wherein the humidity indicator device is secured to the packing reel using a clear plastic disk mounted within an opening in the packing reel.

15. The apparatus of claim 12 wherein the composition of one or more components of the packing reel further comprises an anti-static material.

16. The apparatus of claim 12 wherein the composition of one or more components of the packing reel comprises a mixture of at least one polymer of a single monomer and at least one copolymer mixed with the desiccating material.

17. The apparatus of claim 16 wherein the surface layers of the one or more components of the packing reel comprise a migration zone with a thickness from about 1 to about 100 microns.

18. The apparatus of claim 17 wherein the concentration of the desiccating material within the migration zone is from about 2 to about 6 times that of the concentration of the desiccating material within the interior layer of the apparatus.

19. The apparatus of claim 12 wherein the composition of one or more components of the packing reel comprises a mixture of two copolymers containing a common monomeric unit mixed with the desiccating material.

20. The product of claim 12 whereby a wicking fiber is not added to the plastic material and the desiccating material.

21. A process for filling and shipping of an apparatus for packaging integrated circuits comprising
one of introducing integrated circuits into or onto a carrier tape,
baking the integrated circuits while in or on the carrier tape,
securing the carrier tape to the packing reel, wherein one or more components of the packing reel is comprised of a plastic material, a copolymer and a desiccating material for absorbing moisture; wherein the one or more components of the packing reel comprise a surface layer and an interior layer, wherein the desiccating material is entirely entrained within the plastic material of the one or more components, wherein the desiccating material forms a concentration gradient, and wherein the desiccating material is more highly concentrated in the surface layer than in the interior layer of the one or more components, and
placing the packing reel and carrier tape containing integrated circuits within a moisture-proof barrier bag.

22. The process of claim 21 wherein the packing reel further comprises a humidity indicator device.

23. The process of claim 21 wherein the composition of one or more of the components of the packing reel is further comprised of an electrostatic dissipating material.

24. A process for filling and shipping of a packaging container containing integrated circuits, comprising
one of introducing dry, baked integrated circuits into or onto a carrier tape,
securing the carrier tape to a packing reel wherein the composition of one or more components of the packing reel is comprised of a plastic material, a copolymer and a desiccating material for absorbing moisture; wherein the one or more components of the packing reel comprise a surface layer and an interior layer, wherein the desiccating material is entirely entrained within the plastic material of the one or more components, wherein the desiccating material forms a concentration gradient, and wherein the desiccating material is more highly concentrated in the surface layer than in the interior layer of the one or more components, and
placing the packing reel and carrier tape containing dry baked integrated circuits within a moisture-proof barrier bag.

25. The process of claim 24 wherein the packing reel further comprises a humidity indicator device.

26. The process of claim 24 wherein the composition of one or more of the components of the packing reel is further comprised of an electrostatic dissipating material.

27. A process for filling and shipping of a packaging container containing integrated circuits, comprising
one of introducing the integrating circuits into cavities or openings in a carrier tape,
securing the carrier tape to a packing reel, wherein one or more components of the packing reel are comprised of a plastic material, a copolymer and a desiccating material for absorbing moisture, wherein the one or more components of the packing reel comprise a surface layer and an interior layer, wherein the desiccating material is entirely entrained within the plastic material of the one or more components, wherein the desiccating material forms a concentration gradient, and wherein the desiccating material is more highly concentrated in the surface layer than in the interior layer of the one or more components,
baking the integrated circuits in situ, and
placing the packing reel and carrier tape containing integrated circuits within a moisture-proof barrier bag.

28. The process of claim 27 wherein the packing reel further comprises a humidity indicator device.

29. The process of claim 27 wherein the composition of one or more components of the packing reel is further comprised of an electrostatic dissipating material.

* * * * *